United States Patent
Tay et al.

(10) Patent No.: US 6,204,484 B1
(45) Date of Patent: Mar. 20, 2001

(54) SYSTEM FOR MEASURING THE TEMPERATURE OF A SEMICONDUCTOR WAFER DURING THERMAL PROCESSING

(75) Inventors: Sing Pin Tay, Fremont; Yao Zhi Hu, San Jose, both of CA (US)

(73) Assignee: Steag RTP Systems, Inc., San Jose, CA (US)

( * ) Notice: Subject to any disclaimer, the term of this patent is extended or adjusted under 35 U.S.C. 154(b) by 0 days.

(21) Appl. No.: 09/052,506

(22) Filed: Mar. 31, 1998

(51) Int. Cl.⁷ .............................. A21B 1/00; C23C 16/00; F26B 3/30
(52) U.S. Cl. .......................... 219/411; 118/725; 392/411
(58) Field of Search .................................. 219/411, 412, 219/353, 553; 392/412, 416; 34/519, 201; 250/493.1; 602/1, 81; 374/129, 120, 179, 185, 153; 118/725

(56) References Cited

U.S. PATENT DOCUMENTS

| | | |
|---|---|---|
| 3,801,949 | 4/1974 | Larrabee . |
| 4,396,640 | 8/1983 | Rocheleau et al. . |
| 4,607,591 | 8/1986 | Sitz . |
| 4,668,530 | 5/1987 | Reif et al. . |
| 4,678,432 * | 7/1987 | Teraoka .................... 432/12 |
| 4,734,267 | 3/1988 | Kojima . |
| 4,777,022 | 10/1988 | Boldish et al. . |
| 4,924,073 * | 5/1990 | Chiba .................... 219/413 |
| 4,957,777 | 9/1990 | Ilderem et al. . |
| 4,989,992 | 2/1991 | Piai . |
| 4,993,355 | 2/1991 | deBoer et al. . |
| 4,996,942 | 3/1991 | deBoer et al. . |
| 5,117,769 | 6/1992 | deBoer et al. . |
| 5,231,690 | 7/1993 | Soma et al. . |
| 5,232,509 | 8/1993 | Min et al. . |
| 5,315,092 | 5/1994 | Takahashi et al. . |
| 5,356,486 * | 10/1994 | Sugarman et al. .................... 136/230 |
| 5,414,244 * | 5/1995 | Imahashi .............................. 219/497 |
| 5,490,228 | 2/1996 | Soma et al. . |
| 5,567,909 | 10/1996 | Sugarman et al. . |
| 5,707,500 * | 1/1998 | Shimamura ...................... 204/298.03 |
| 5,864,119 * | 1/1999 | Vogt et al. ........................... 219/388 |
| 5,910,264 * | 6/1999 | Dauliach .............................. 219/411 |
| 5,911,896 * | 6/1999 | Mahawili .............................. 427/10 |
| 5,915,072 * | 6/1999 | Campbell et al. .................... 392/418 |

* cited by examiner

Primary Examiner—Teresa Walberg
Assistant Examiner—Daniel Robinson
(74) Attorney, Agent, or Firm—Dority & Manning, P.A.

(57) ABSTRACT

An apparatus for heat treating semiconductor wafers is disclosed. In accordance with the present invention, the apparatus includes a temperature measuring system for determining the temperature of semiconductor wafers being heated within the apparatus. The temperature measurement system includes a shield member made from, for instance, ceramic which is placed adjacent to the semiconductor wafer being heated. A temperature measuring device, such as a thermocouple, is placed in association with the shield member. As the wafer is heated, the temperature of the shield member is monitored. Based on a predetermined calibration curve, by knowing the temperature of the shield member, the temperature of the semiconductor wafer can be estimated with reasonable accuracy.

22 Claims, 4 Drawing Sheets

——— calculated temperature
– – – actual temperature

SYSTEM FOR MEASURING THE TEMPERATURE OF A SEMICONDUCTOR WAFER DURING THERMAL PROCESSING

FIELD OF THE INVENTION

The present invention is generally directed to thermal processing chambers for heating semiconductor wafers using light energy. More particularly, the present invention is directed to a method and system for determining the temperature of a semiconductor wafer during heat treatment. In particular, the temperature of the wafer is monitored using a thermocouple placed in association with a ceramic shield which is positioned adjacent to the wafer.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. During heating, various processes can be carried out within the thermal processing chamber, such as rapid thermal oxidation, nitridation, annealing and silicidation.

Many semiconductor heating processes require a wafer to be heated to high temperatures so that the various chemical and physical transformations can take place as the wafer is fabricated into a device. During rapid thermal processing, for instance, semiconductor wafers are typically heated by an array of lights to temperatures from about 400° C. to about 1,200° C., for times which are typically less than a few minutes. During these processes, one main goal is to heat the wafers as uniformly as possible.

During the rapid thermal processing of a semiconductor wafer, it is desirable to monitor and control the wafer temperature. In particular, for all of the high temperature wafer processes of current and foreseeable interest, it is important that the true temperature of the wafer be determined with high accuracy, repeatability and speed. The ability to accurately measure the temperature of a wafer has a direct payoff in the quality and size of the manufactured integrated circuit. For instance, the smallest feature size required for a given semiconductor device limits the computing speed of the finished microchip. The feature size in turn is linked to the ability to measure and control the temperature of the device during processing.

In the past, the temperature of semiconductor wafers has been monitored during heat treatment using radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy. Pyrometers, however, measure an apparent temperature of an object instead of its true temperature. In particular, the temperature of an object sensed by a pyrometer is dependent upon the object being opaque and upon the object's emissivity, which is rarely known for semiconductor wafers.

Thus, in order to measure the true temperature of a semiconductor wafer during heat treatment using a pyrometer, the indicated temperature must be corrected to account for the emissivity. Unfortunately, the emissivity of a semiconductor wafer is generally unknown and is very difficult to measure accurately. The emissivity of semiconductor wafers, which varies from wafer to wafer, is a property of the surface and depends on several parameters, such as the chemical composition of the wafer, the thickness of the wafer, the surface roughness of the wafer, the temperature of the wafer, and the wavelength at which the pyrometer operates. Further, at lower temperatures, semiconductor wafers can be partially transparent thus causing the emissivity of the wafer to vary. Consequently, one major drawback to measuring the temperature of semiconductor wafers using pyrometers is that the pyrometers cannot accurately determine the temperature of the wafers at lower temperatures, such as below about 500° C.

Besides using pyrometers, it has also been proposed in the past to use thermocouples for monitoring the temperature of the wafers. Thermocouples generally measure the true temperature of objects. In order for thermocouples to measure the temperature of an object, however, the thermocouple typically has to be in contact with the object, which presents a number of disadvantages. For instance, when in contact with a wafer being heated, a thermocouple can create temperature discontinuities throughout the wafer. Attaching a thermocouple to a wafer also makes it more difficult to rotate the wafer during processing. Rotating the wafer during heat treatment is generally preferred in order to enhance temperature uniformity and promote uniform contact between the wafer and any gases contained within the chamber. Having to place a thermocouple in contact with a wafer being heated also can make it more difficult to load and unload wafers from the chamber since the wafer has to be properly aligned with the thermocouple prior to being heated.

In view of the above, a need currently exists for a system and method of measuring the temperature of semiconductor wafers during thermal processing applications, especially when the wafers are at lower temperatures. A need also exists for a system for measuring the temperature of semiconductor wafers using thermocouples wherein the thermocouples do not have to be placed in contact with the wafers.

SUMMARY OF THE INVENTION

The present invention recognizes and addresses the foregoing disadvantages and others of prior art constructions and methods.

Accordingly, it is an object of the present invention to provide an improved system and process for measuring the temperature of semiconductor wafers in thermal processing chambers.

Another object of the present invention is to provide a method and system for determining the temperature of an object being heated using non-contact thermocouples.

Still another object of the present invention to provide a system for determining the temperature of a semiconductor wafer in a thermal processing chamber by monitoring with a thermocouple the temperature of a ceramic shield member placed adjacent to the wafer.

These and other objects of the present invention are achieved by providing an apparatus for heat treating semiconductor wafers while simultaneously monitoring the temperature of the wafers. The apparatus includes a thermal processing chamber adapted to contain and heat semiconductor wafers. In particular, for heating the wafers, a heating device is placed in communication with the thermal processing chamber. The heating device can include, for instance, a plurality of light energy sources which emit thermal light energy onto the wafers.

In accordance with the present invention, a shield member is contained within the thermal processing chamber and is positioned adjacent to a semiconductor wafer being heated. The shield member is made from a material that increases in temperature as the semiconductor wafer is heated. For instance, the shield member can be made from a ceramic material.

A temperature sensing device is placed in association with the shield member for monitoring the temperature of the shield member during thermal processing. According to the present invention, by monitoring the temperature of the shield member during thermal processing, the temperature of the semiconductor wafer is capable of being derived. In particular, a calibration curve can be constructed for determining a relationship between the temperature of the heating device and the temperature of the semiconductor wafer. Through the calibration curve, the temperature of the semiconductor wafer can thus be determined by determining the temperature of the shield member.

For instance, in one embodiment, the temperature of the shield member can be monitored using one or more thermocouples. In this manner, thermocouples can be used to monitor the temperature of the semiconductor wafer without the requirement of having the thermocouples contact the wafer. It should be understood, however, that besides thermocouples other temperature sensing devices can be used to monitor the temperature of the shield member. For instance, if the shield member is substantially opaque and has a known emissivity, pyrometers can be used to monitor its temperature.

The present invention is particularly well suited for monitoring the temperature of semiconductor wafers at relatively lower temperatures, such as less than about 500° C. As described above, conventional pyrometers are not well suited for monitoring the temperature of semiconductor wafers at lower temperatures.

In one preferred embodiment, the shield member is placed in association with a thermocouple or a plurality of thermocouples. For example, in one embodiment, different thermocouples can be placed at different locations on the shield member for monitoring the temperature of the shield member at the different locations. The thermocouples can be placed inside the shield member or can be secured to a surface of the shield member.

In an alternative embodiment, besides including thermocouples that monitor the temperature of the shield member, one or more other thermocouples can be used to directly measure the temperature of the semiconductor wafer. For instance, a thermocouple can be placed within a thermocouple holder and positioned adjacent to the wafer. The thermocouple holder can be adapted to allow for movement of the thermocouple for placing the thermocouple as close as possible to the wafer being heated. The thermocouple can then directly measure the temperature of the wafer which can be used with the other temperature measuring devices for further improving the accuracy of the system.

In one embodiment, the system of the present invention can include a controller, such as a microprocessor, which can be placed in communication with the temperature sensing devices. The controller can also be placed in communication with the heating device which, in one embodiment, can be a plurality of light energy sources. Based upon the temperature information received from the temperature sensing devices, the controller can be programmed to control the amount of thermal energy being emitted by the heating device for heating the wafer according to a preset temperature regime.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a method and to a system for determining the temperature of an object, particularly a semiconductor wafer, in a thermal processing chamber during heat treatment. The system of the present invention is particularly well suited to determining the temperature of semiconductor wafers at relatively lower temperatures, such as less than about 500° C. According to the present invention, the temperature of wafers can be accurately determined during such processes as rapid thermal oxidation, nitridation, annealing, and silicidation.

In order to determine the temperature of a semiconductor wafer according to the present invention, a shield member such as made from a ceramic material or other suitable material is placed adjacent to a semiconductor wafer being heated in a thermal processing chamber. A temperature sensing device which, in one embodiment, is a thermocouple, is either securely affixed to the shield member or inserted into a thermocouple holder built into the shield member. During thermal processing, the shield member heats up along with the semiconductor wafer. The temperature sensing device monitors the temperature of the shield member. From a predetermined calibration curve, the temperature of the semiconductor wafer is then determined by knowing the temperature of the shield member.

The temperature measurement system of the present invention offers many advantages over prior art constructions. For instance, the system not only can monitor and control a wide range of temperatures, but is also particularly well suited to monitoring relatively low temperatures, such as less than about 500° C. At lower temperatures, semiconductor wafers tend to be partially transparent, making it very difficult to monitor the temperature of the wafers using conventional pyrometers. The system and process of the present invention, however, overcome these deficiencies.

Another advantage of the present invention is that the temperature of the semiconductor wafer is calculated independent of the emissivity of the wafer. Additionally, the temperature of the wafer is determined without having to contact the wafer or otherwise interfere with the wafer as it is being heated. Further, the system of the present invention is easy to maintain and is not expensive to incorporate into thermal processing chambers.

Figure 1:
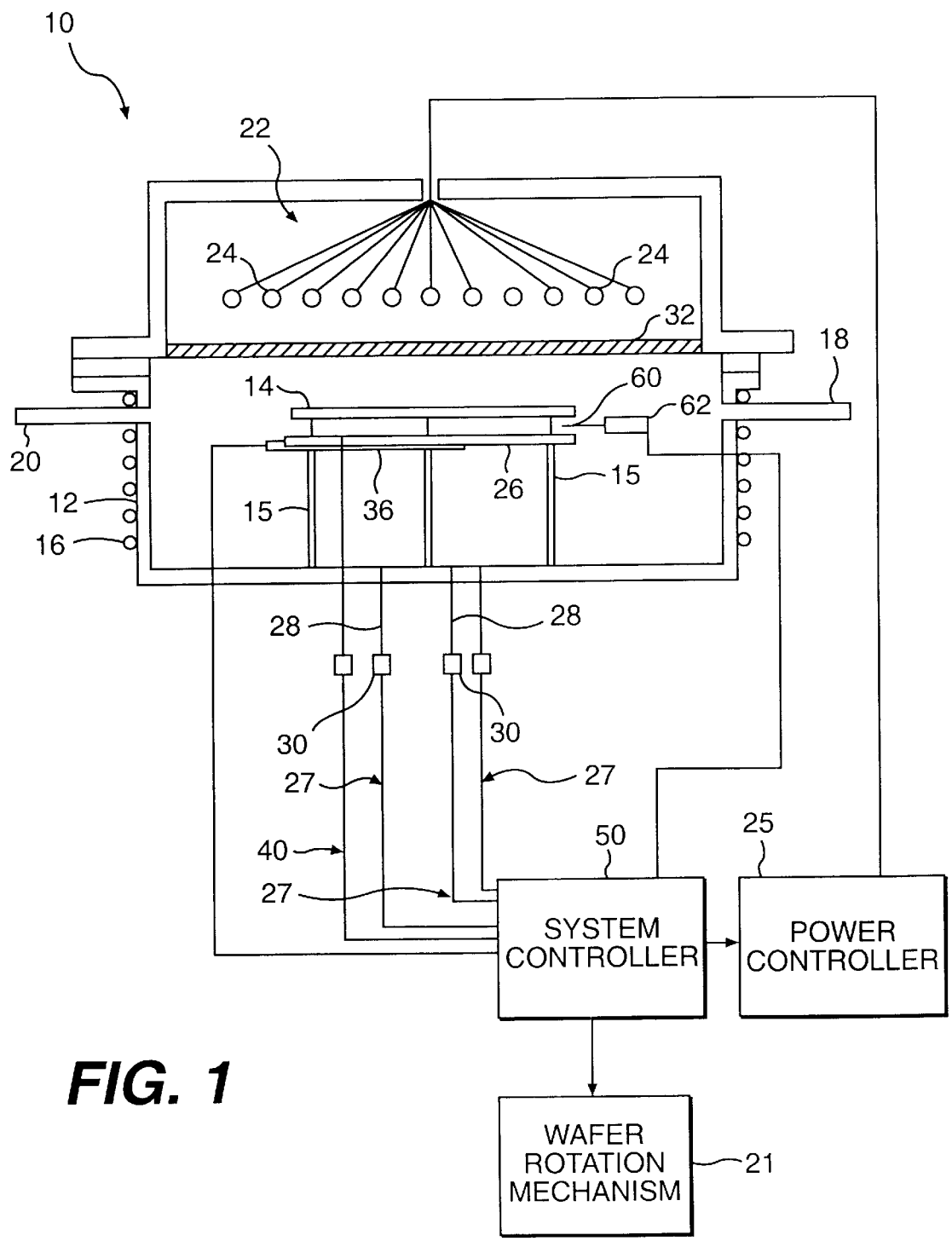
FIG. 1 is a cross-sectional view of one embodiment of a thermal processing chamber made in accordance with the present invention.

Referring to FIG. 1, a system 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired, such as below wafer 14.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the thermal energy being emitted by the lamps.

As shown in FIG. 1, in this embodiment, system 10 includes a window 32 which is positioned between lamps 24 and thermal processing chamber 12. Window 32 serves to isolate lamps 24 from wafer 14 and prevent contamination of the chamber.

In accordance with the present invention, in order to monitor the temperature of wafer 14 during the heating process, thermal processing chamber 12 includes a shield member 26 placed adjacent to the wafer. Shield member 26 is made from a material that will increase in temperature as the wafer is heated. In particular, shield member 26 should be made from a material that will have heating characteristics somewhat similar to wafer 14. In this manner, through testing and calibration, a curve can be constructed for correlating temperatures between shield member 26 and semiconductor wafer 14. Specifically, a calibration curve constructed in accordance with the present invention will indicate the temperature of wafer 14 by knowing the temperature of shield member 26 during thermal processing.

Shield member 26 can be calibrated to give accurate temperature readings in a number of ways. For instance, shield member 26 can be heated in combination with a semiconductor wafer. In particular, the wafer being heated can be directly connected to a thermocouple. During heating, the temperature of the wafer can be monitored while simultaneously monitoring the temperature of the shield member. From this data, a calibration curve can be constructed.

Alternatively, as shown in FIG. 1, system 10 can include a radiation sensing device 40, such as a pyrometer, which is configured to sense the amount of thermal radiation being emitted by semiconductor wafer 14. In this embodiment, radiation sensing device 40 can monitor the temperature of wafer 14 while the temperature of shield member 26 can be simoultaneously monitored during a heating cycle. From this data, a calibration curve can be constructed. When using pyrometer 40 to calibrate the shield member, however, the emissivity of the wafer being heated must be known and the wafer must be substantially opaque while the temperature data is being collected from the radiation sensing device.

Shield member 26 can be made from various materials. For example, shield member 26 can be made from ceramic. Particular ceramic materials that can be used in the present invention include silicon carbide, such as hot pressed silicon carbide or silicon carbide formed by chemical vapor deposition, polycrystalline silicon, or substrates coated with silicon carbide.

Besides providing a basis for determining the temperature of semiconductor wafer 14 in thermal processing chamber 12, shield member 26 also serves to promote temperature uniformity throughout the wafer. For instance, during thermal processing, shield member 26 increases in temperature. Once heated, the shield member emits thermal radiation which is absorbed by the wafer in a manner that promotes a uniform temperature distribution throughout the wafer.

In order to monitor the temperature of shield member 26 during thermal processing, the system of the present invention includes a temperature sensing device. For instance, in one preferred embodiment of the present invention, the temperature of shield member 26 is monitored by a thermocouple 36, which is placed in direct contact with the shield member. In general, any suitable thermocouple may be used in the process of the present invention. For instance, thermocouple 36 can be an R-type thermocouple, an S-type thermocouple or a thin film thermocouple. Further, more than one thermocouple can be placed in association with shield member 26 for monitoring the temperature of the shield member at a variety of locations.

Figure 2:
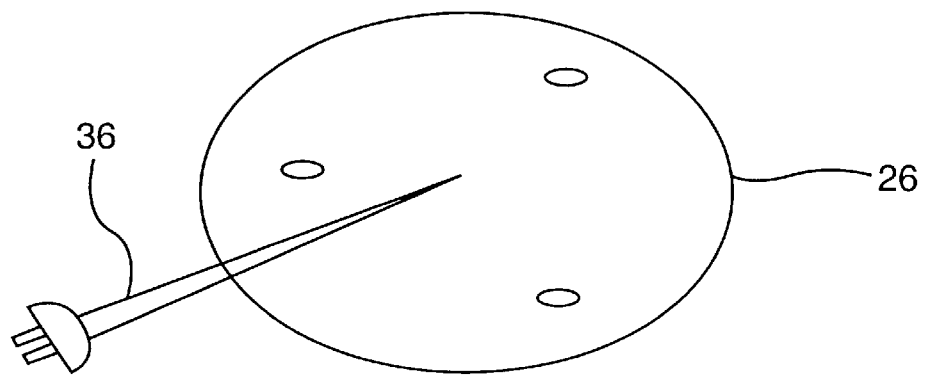
FIG. 2 is a plan view of one embodiment of a thermocouple and shield member configuration made in accordance with the present invention.
Figure 3:
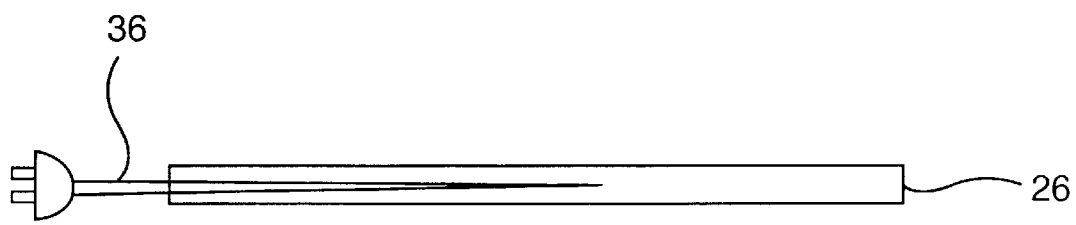
FIG. 3 is a cross-sectional view of an alternative embodiment of a thermocouple and shield member configuration made in accordance with the present invention.

Referring to FIGS. 2 and 3, two different embodiments for attaching thermocouple 36 to shield member 26 are illustrated. For instance, as shown in FIG. 2, thermocouple 36 is affixed, such as through the use of an adhesive, to a surface of shield member 26. In particular, in this embodiment, thermocouple 36 is affixed to the backside of the shield member so as not to be placed in between the shield member and wafer 14. In this manner, thermocouple 36 only indicates the temperature of the shield member and is prevented from receiving interference from the wafer.

In FIG. 3, on the other hand, thermocouple 36 is buried within shield member 26. For instance, thermocouple 36 can be permanently secured to shield member 26 such as by being embedded within the shield member during formation. Alternatively, shield member 26 can be formed to contain a thermocouple holder into which the thermocouple is inserted.

Besides using thermocouple 36 or in addition to using thermocouple 36, system 10 can also include one or more radiation sensing devices 27 for monitoring the temperature of shield member 26 during thermal processing. The use of radiation sensing devices for monitoring the temperature of shield member 26 is particularly well suited for applications in which the emissivity of shield member 26 is known and at temperatures where shield member 26 is substantially opaque.

Radiation sensing devices 27 include optical fibers or light pipes 28 which are, in turn, in communication with corresponding light detectors 30. Optical fibers 28 are configured to receive thermal energy being emitted by shield member 26 at a particular wavelength. The amount of sensed radiation is then communicated to light detectors 30 which generate a usable voltage signal for determining the temperature of the shield member which can be calculated based, in part, on Planck's Law. In one embodiment, each optical fiber 28 in combination with a light detector 30 comprises a pyrometer.

As shown in FIG. 1, system 10 can further include a system controller 50 which can be, for instance, a microprocessor. Controller 50 is placed in communication with thermocouple 36 and light detectors 30. In particular, controller 50 is configured to receive voltage signals from the temperature sensing devices indicating the temperature of shield member 26. Based on the signals received, controller 50 is then configured to calculate the temperature of semiconductor wafer 14.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

In an alternative embodiment of the present invention, as shown in FIG. 1, in addition to thermocouple 36, a thermocouple 60 can be placed within a thermocouple holder 62 and positioned adjacent to semiconductor wafer 14. In this embodiment, thermocouple 60 is for directly measuring the temperature of semiconductor wafer 14 for further increasing the accuracy of temperature determinations made according to the present invention. In order to place thermocouple 60 as close as possible to wafer 14, thermocouple holder 62 can be designed so as to allow movement of the thermocouple. In this manner, during thermal processing, thermocouple 60 can be moved adjacent to the wafer through micromanipulation. As shown, thermocouple 60 can be in communication with system controller 50 which can use information received from thermocouple 60 in combination with information received from the other temperature sensing devices to accurately measure and control the temperature of the wafer.

The present invention may be better understood with reference to the following example.

EXAMPLE

The following example was performed in order to demonstrate the effectiveness of the system of the present invention in measuring the temperature of a semiconductor wafer in a thermal processing chamber during heat treatment.

In this experiment, a semiconductor wafer was placed in a thermal processing chamber and attached to a thermocouple. A shield member made in accordance with the present invention was placed adjacent to the wafer.

The semiconductor wafer was heated and its temperature was monitored by the thermocouple affixed to the wafer. During heating, the temperature of the shield member was also monitored. Based on this data, a calibration curve was constructed for the shield member. In particular, the curve established a relationship between the temperature of the shield member in relation to the temperature of an adjacent semiconductor wafer.

After calibration, two different wafers were placed in the thermal processing chamber and heated. The first wafer was bare silicon and had an emissivity of about 0.68. The second wafer tested had an emissivity of approximately 0.39.

Figure 4:
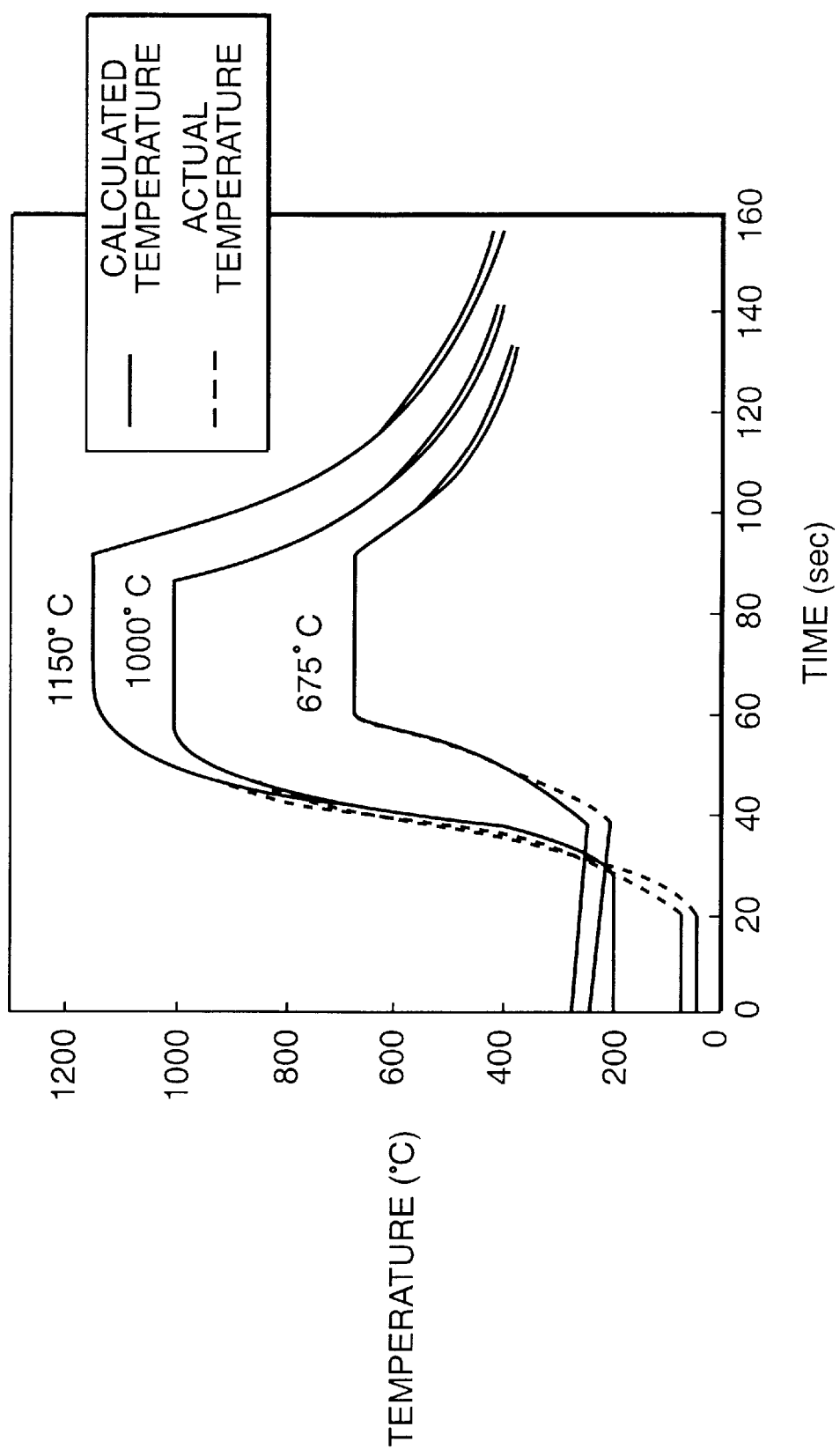
FIG. 4 is a graphical representation of the results obtained in the Example.
Figure 5:
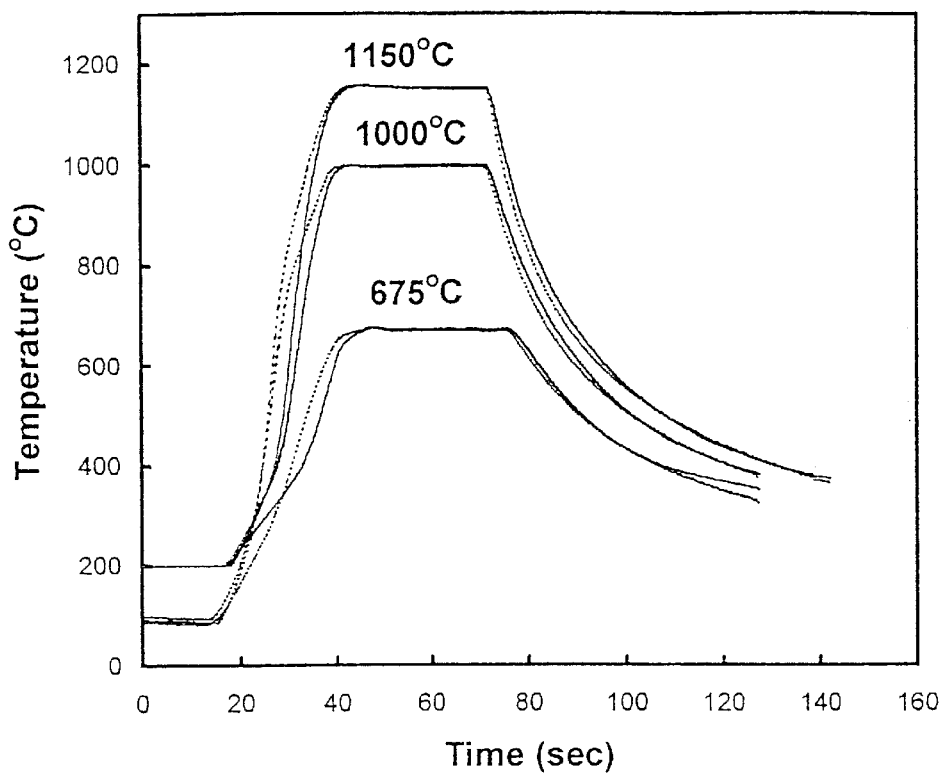
FIG. 5 is a graphical representation of the results obtained in the Example.

Each of the semiconductor wafers placed in the thermal processing chamber were attached to a thermocouple so that their temperatures can be accurately monitored. The wafers were heated and both the temperature of the wafer and the temperature of the shield member were recorded. Based upon the temperature of the shield member, the temperature of the wafer was also calculated. The results illustrated in FIGS. 4 and 5 along with the results illustrated in the following table were obtained:

TABLE 1

| Actual Temperature (° C.) | Silicon Wafer (E = 0.68) Calculated Temperature (° C.) | Silicon Wafer (E = 0.389) Calculated Temperature (° C.) |
| --- | --- | --- |
| 300 | 306 | 299 |
| 500 | 494 | 504 |
| 675 | 674 | 671 |
| 1000 | 1006 | 997 |
| 1150 | 1152 | 1157 |

As shown above, the temperature measurement system of the present invention was very accurate in determining the actual temperature of the semiconductor wafers during heat treatment. Of particular advantage, the system was capable of accurately determining the temperature of the wafers at temperatures of 500° C. and less.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of monitoring the temperature of a semiconductor wafer in a thermal processing chamber during thermal treatment comprising the steps of:

placing a semiconductor wafer in a thermal processing chamber;

placing a shield member adjacent to said semiconductor wafer in said thermal processing chamber without contacting said semiconductor wafer, said shield member being made from a ceramic material that increases in temperature as said semiconductor wafer is heated, said shield member having a predetermined temperature relationship with said semiconductor wafer;

exposing said semiconductor wafer to light energy for directly heating said wafer and indirectly heating said shield member in said thermal processing chamber;

monitoring the temperature of said shield member while said semiconductor wafer is heated; and determining the temperature of said semiconductor wafer based on the temperature of said shield member according to the predetermined relationship between the shield member and the wafer.

2. A method as defined in claim 1, wherein the temperature of the shield member is monitored using at least one thermocouple.

3. A method as defined in claim 2, wherein the temperature of said shield member is monitored in a plurality of locations by a plurality of thermocouples.

4. A method as defined in claim 1, further comprising the step of controlling the amount of light energy being delivered to said thermal processing chamber during thermal processing based upon the determined temperature of said semiconductor wafer.

5. A method as defined in claim 4, wherein said amount of light energy being delivered to the thermal processing chamber is controlled by a controller.

6. A method as defined in claim 5, wherein said controller comprises a microprocessor.

7. A method as defined in claim 1, wherein said shield member has a shape similar to said semiconductor wafer.

8. A method as defined in claim 2, wherein said thermocouple is inserted within said shield member.

9. A method as defined in claim 2, wherein said thermocouple is attached to a surface of said shield member.

10. A method of monitoring the temperature of a semiconductor wafer in a thermal processing chamber comprising the steps of:

placing a semiconductor wafer in a thermal processing chamber;

placing a shield member adjacent to said semiconductor wafer in said thermal processing chamber without contacting said semiconductor wafer, said shield member having a predetermined temperature relationship with said semiconductor wafer;

heating said semiconductor wafer by directly exposing said wafer to light energy in said thermal processing chamber;

monitoring the temperature of said shield member while said semiconductor wafer is heated; and determining the temperature of said semiconductor wafer based on the temperature of said shield member according to the predetermined temperature relationship between the shield member and the wafer.

11. A method as defined in claim 10, wherein said shield member is made from a ceramic material.

12. A method as defined in claim 10, wherein said semiconductor wafer is heated by a plurality of light energy sources.

13. A method as defined in claim 10, wherein said shield member has a shape similar to said semiconductor wafer.

14. A method as defined in claim 10, wherein the temperature of the shield member is monitored using at least one thermocouple.

15. A method as defined in claim 10, wherein the temperature of said shield member is monitored in a plurality of locations by a plurality of thermocouples.

16. A method as defined in claim 14, wherein said thermocouple is inserted within said shield member.

17. A method as defined in claim 14, wherein said thermocouple is attached to a surface of said shield member.

18. A method as defined in claim 10, further comprising the step of controlling the amount of light energy being delivered to said thermal processing chamber during thermal processing based upon the determined temperature of said semiconductor wafer.

19. A method as defined in claim 10, wherein said shield members emits thermal radiation onto said semiconductor wafer while said wafer is being heated.

20. A method as defined in claim 10, further comprising the step of directly monitoring the temperature of said semiconductor wafer while said wafer is being heated, the temperature of the wafer being monitored by a thermocouple movably secured to a thermocouple holder within said chamber, said thermocouple being configured to be placed adjacent to the semiconductor wafer.

21. A method as defined in claim 10, further comprising the step directly monitoring the temperature of said semiconductor wafer using a pyrometer.

22. A method as defined in claim 10, wherein said shield member increases in temperature as said semiconductor wafer is heated, and wherein a relationship exists between the rate at which the shield member increases in temperature and the rate at which said semiconductor wafer increases in temperature such that the temperature of said semiconductor wafer is capable of being derived from the temperature of said shield member.

* * * * *